United States Patent
Wang et al.

(10) Patent No.: US 11,515,067 B2
(45) Date of Patent: Nov. 29, 2022

(54) TWO-TERMINAL ACTIVE INDUCTOR DEVICE

(71) Applicant: AALBORG UNIVERSITET, Aalborg Øst (DK)

(72) Inventors: Huai Wang, Aalborg (DK); Haoran Wang, Aalborg Ø (DK)

(73) Assignee: AALBORG UNIVERSITET

(*) Notice: Subject to any disclaimer, the term of this patent is extended or adjusted under 35 U.S.C. 154(b) by 292 days.

(21) Appl. No.: 16/971,772

(22) PCT Filed: Feb. 21, 2019

(86) PCT No.: PCT/DK2019/050064
§ 371 (c)(1),
(2) Date: Aug. 21, 2020

(87) PCT Pub. No.: WO2019/161867
PCT Pub. Date: Aug. 29, 2019

(65) Prior Publication Data
US 2021/0090770 A1    Mar. 25, 2021

(30) Foreign Application Priority Data

Feb. 22, 2018   (DK) .......................... PA 2018 70115

(51) Int. Cl.
  *H01F 7/06*   (2006.01)
  *H01F 7/20*   (2006.01)
  *H03K 17/687*  (2006.01)

(52) U.S. Cl.
  CPC .............. *H01F 7/064* (2013.01); *H01F 7/20* (2013.01); *H03K 17/6871* (2013.01)

(58) Field of Classification Search
  CPC ....... H01F 7/064; H01F 7/20; H03K 17/6871; Y02E 60/60; H02M 1/15; H02J 2003/365; H02J 1/02; H02J 3/36
  (Continued)

(56) References Cited

U.S. PATENT DOCUMENTS

| 7,656,255 B2 | 2/2010 | Abel et al. |
| 8,542,052 B2 | 9/2013 | Halberstadt |

(Continued)

FOREIGN PATENT DOCUMENTS

EP    2424094 A2    2/2012

OTHER PUBLICATIONS

International Patent Application No. PCT/DK2019/050063; Int'l Search Report and the Written Opinion; dated Jun. 21, 2019; 17 pages.

(Continued)

*Primary Examiner* — Dharti H Patel
(74) *Attorney, Agent, or Firm* — BakerHostetler

(57) ABSTRACT

An active two-terminal inductor device with a controllable inducitance based on an inductance value input L_I. A processor system PRS executes an algorithm which controls a power converter PCV with controllable electric switches connected to the two external terminals A, B along with a fixed value inductor component L1. Based on sampling of at least a voltage or a current in connection with the inductor component L1, the algorithm controls the power converter PCV to provide a resulting inductance across the external terminals A, B which serves to match the inductance value input L_I.

27 Claims, 10 Drawing Sheets

(58) Field of Classification Search
USPC .................................................... 361/143
See application file for complete search history.

(56) References Cited

U.S. PATENT DOCUMENTS

| | | | |
|---|---|---|---|
| 9,294,053 B2 | 3/2016 | Endou et al. | |
| 9,912,247 B2 | 3/2018 | Chung et al. | |
| 2014/0347896 A1 | 11/2014 | Chung et al. | |
| 2015/0032396 A1* | 1/2015 | Pazhayaveetil | G01R 21/06 702/65 |

OTHER PUBLICATIONS

Wang et al.; "Impedance Characteristics Modeling of a Two-Terminal Active Capacitor"; Dept. of Energy Technology; Aalborg University, Denmark, IEEE; XP033144025; 2017; 7 pages.

Wang et al.; "A Voltage Control Method for an Active Capacitive DC-link Module with Series-Connected Circuit"; Center of Reliable Power Electronics (CORPE), Dept. of Energy Technology, Aalborg University, Denmark, IEEE; XP033129922; 2017; p. 221-225.

Wang et al., "A Two-Terminal Active Capacitor", IEEE Transactions on Power Electronics, vol. 32, No. 8, Aug. 2017, pp. 5893-5896.

"Duality", Slideshow, found on https://filebox.ece.vt.edu/~LiaB/Lectures/Ch_8/; Retrieved on Sep. 12, 2017, 8 pages.

Davari et al., "A Review of Electronic Inductor Technique for Power Factor Correction in Three-Phase Adjustable Speed Drives", Department of Energy Technology, Aalborg University, Denmark, IEEE, 2016, 8 pages.

Rana et al., "Analysis and Design of Active Inductor as DC-Link Reactor for Lightweight Adjustable Speed Drive Systems", Power Electronics & Power Quality Laboratory, Texas A&M University, USA, IEEE, XP032681079, 2014 pp. 3243-3250.

Li et al., "A General Approach to Programmable and Reconfigurable Emulation of Power Impedances", IEEE Transactions on Power Electronics, vol. 33, No. 1, XP011662035, Jan. 2018, pp. 259-271.

Funato et al., Proposal of Variable Active-Passive Reactance Department of Electrical and Computer Engineering,Yokohama National University, IEEE, XP010060666, 1992, pp. 381-388.

International Search Report and Written Opinion issued in PCT/DK2019/050064, dated Jun. 21, 2019.

\* cited by examiner

TWO-TERMINAL ACTIVE INDUCTOR DEVICE

CROSS-REFERENCE TO RELATED APPLICATIONS

This application is the National Stage of International Patent Application No. PCT/DK2019/050064, "A Two-Terminal Active Inductor Device" (filed Feb. 21, 2019), which claims priority to Danish Patent Application No. PA 2018 70115 (filed Feb. 22, 2018). The foregoing applications are incorporated herein by reference in their entireties for any and all purposes.

FIELD OF THE INVENTION

The present invention relates to the field of power electric systems or power electronic systems, more specifically the invention provides a two-terminal active inductor device for use in power electric systems, e.g. converters. The device can be made compact compared to a traditional inductor component with the same electric inductance, and the inductance value may be programmable.

BACKGROUND OF THE INVENTION

Inductors are among the key components in power electric systems in terms of cost, volume and weight. Inductors are used in switching circuits such as DC-DC, AC-DC, DC-AC converters, DC-link applications, online damping for stability, adaptive energy buffering etc. The inductors are normally wire, e.g. copper wire, wound to form a coil, and thus inductors suited for high currents and high inductance introduce significant weight.

Especially, high inductance inductors often used in power (e.g. 10 W to several MW) electric systems are expensive, bulky, and often the inductors constitute a significant part of the total weight of power electric circuits.

Furthermore, in the manufacturing process, each fixed inductance value needs its own manufacturing process line. Adjustable inductors are known, but such components are rare in case of high inductance values.

SUMMARY OF THE INVENTION

Thus, according to the above description, it is an objective of the present invention to provide a compact, low weight, and low cost inductor device with the capability to provide a high inductance which is adjustable according to an inductance value input. Further, the device should preferably be capable of being used in a wide range of applications at different electric power from low power to high power applications.

In a first aspect, the invention provides an inductor device with a controllable electric inductance value input, comprising an enclosure,
a power converter comprising a plurality of interconnected controllable electric switches,
a first inductor component with a fixed inductance, and being electrically connected to the power converter,
two external electric terminals arranged to be externally accessible from outside the enclosure, wherein at least one of the two external electric terminals are connected to the first inductor component and the power converter, and a processor system arranged to sense at least one input voltage or current related to one of the two external electric terminals and the first inductor component and to process the sensed at least one input voltage or current according to an algorithm configured to control the power converter, so as to provide a resulting electric inductance between the two external electric terminals which corresponds to the controllable electric inductance value input.

Such inductor device is advantageous, since it can be seen as an active inductor with an adjustable inductance value, especially in embodiments with a self-powering circuit. Still it can be provided in a two-terminal package, thus being easy to incorporate in existing power circuits as a replacement for a traditional inductor component with a fixed inductance. Especially, the two external electric terminals may be arranged with the same mutual distance as existing passive inductor components, thus facilitating replacement of existing components without further changes.

The fact that the inductance value is controlled by a processor system means, that a high inductance can be obtained within an enclosure with compact dimensions compared with a traditional passive inductor component with the same inductance. Thus, based on a small passive inductor, the first inductor component, it is possible to provide a high inductance seen from the two external electric terminals, and thus a significant weight and volume reduction can be obtained compared to using a passive inductor with the same high inductance.

Furthermore, the inductor device is suitable also for high power applications, since it is possible to implement with switching circuit topologies with a minimum of power loss.

Even further, the inductor device can be configured to allow on-line adjustment of the resulting inductance in response to a voltage across the two external electric terminals. E.g. the adjustable inductance value input may be a nominal inductance value, if the observed voltage or current is within a threshold value, whereas the resulting inductance can be determined in response to the voltage or current, in case the voltage or current is outside the threshold value. Hereby, it is possible to provide a resulting inductance which is responsive to the operating condition, e.g. load or impedance matching, of the application in which the inductor device is applied. This may allow increased efficiency of power electric applications which is not possible with an inductor component having a fixed inductance.

In the following, preferred features and embodiments will be described.

Especially, the algorithm is configured to provide a resulting inductance being at least a factor of 2 times, e.g. at least a factor of 5 times, e.g. of least a factor of 10 times, the fixed inductance of the first inductor component.

The processor system may be implemented with a digital processor, e.g. a digital microcontroller, or the algorithm may be implemented as an analog controller by means of an analog electronic circuit. In the case of a digital processor, the processor system may comprise a sampling circuit arranged to sample said sensed at least one input voltage or current and to generate a digital signal output accordingly,
a digital processor configured to execute an algorithm stored in a memory, which algorithm is configured to generate a control signal to control the power converter in response to the digital signal output from the sampling circuit, so as to provide said resulting electric inductance between the two external electric terminals, and a gate driver circuit arranged to control the plurality of controllable electric switches in response to the control signal from the processor.

Preferably, the enclosure is configured for housing the first inductor component, the power converter, as well as the processor system, e.g. the enclosure being a box-shaped enclosure, e.g. a polymeric or metallic enclosure, with both of the two external electric terminals being arranged on one side, or being arranged on respective sides of the enclosure. Especially, the enclosure further houses a self-powering circuit and/or a battery. Hereby, a two-terminal active inductor device is provided which, from the outside, is similar to a traditional passive inductor component. At least the enclosure preferably serves to provide electric isolation.

In embodiments, the power converter and the processor system may be arranged inside a resin or a gel and positioned within the enclosure along with the first inductor component. Hereby, a inductor device can be obtained with an increased inductance compared to the inductance of the first inductor component, and still sharing an enclosure which may be comparable with a traditional passive inductor component.

Preferably, the inductor device comprises a self powering circuit connected to receive electric power from the two external electric terminals in a direct or indirect manner, and to convert said electric power for powering the power converter, and the processor system. Hereby, the inductor device can function as a traditional two-terminal inductor component without additional inputs necessary. In some applications, a battery may be used to provide the necessary power instead or in addition to the self powering circuit.

The processor system, the power converter, and the first inductor component may be arranged on one single Printed Circuit Board (PCB), thereby providing a compact element for fitting inside a compact enclosure.

The inductor device may be arranged to receive the controllable electric inductance value input in a large variety of different ways, depending on the preferred application. In some embodiments, the controllable electric inductance value input is provided as a pre-stored value in the algorithm stored in the memory, wherein the inductance value input is provided one time only during manufacturing of the inductor device. In other embodiments, the inductance value input can be provided in the form of an input during normal operation of the inductor device.

In preferred embodiments, the inductor device is configured to receive the controllable electric inductance value input into said memory. Especially, said algorithm may involve an adjustable factor or coefficient which is adjustable in response to the inductance value input. Thus, hereby the resulting inductance value can be programmed into the memory in which the algorithm is stored. Especially, a predetermined relation between said factor or coefficient and the resulting inductance value may be stored in memory, so as to allow conversion of a inductance value input and said factor or coefficient.

Especially, the inductor device may be configured to receive the controllable electric inductance value input into said memory from outside the enclosure, e.g. by means of at least one externally accessible electric terminal, and/or by means of a wireless interface. This allows the inductance value input to be entered after manufacturing of the inductor device, e.g. during normal operation of the inductor device. Thus, one inductor device hardware can be used for different inductance values. E.g. such wireless interface can be obtained with a processor based on a digital microprocessor such as MCU CC430™ or CC2640™ facilitating a 1 GHz radio interface, which allows external programming of the algorithm, and thus also wireless entering the inductance value input, during manufacturing, or by a user during normal operation of the inductor device.

Alternatively, the inductor device may be configured to receive the controllable electric inductance value input by means of a pre-programmed Read Only Memory (ROM) type memory which at least contains a preprogrammed code indicative of the controllable electric inductance value input. This allow pre-programming of the inductance value input, e.g. to allow pre-manufacturing of an element comprising the processor, power converter, and the first inductor, where the ROM memory can be selected to determine the resulting inductance of the inductor device in the final manufacturing step.

In some embodiments, the inductor device is configured to receive the controllable electric inductance value input by means of an adjustable device, e.g. a potentiometer or the like, with a plurality of different settings which can be read by the processor. Especially, the adjustable device can be mounted on the same PCB on which at least the processor system is mounted. Such adjustable device allows manufacturing of one inductor device hardware, which can then manually be adjusted, e.g. by a user, to provide a specific resulting inductance.

In some embodiments, the processor system, e.g. a sampling circuit, is arranged to sense a voltage or current, e.g. a voltage or current related to the two external electric terminals or a voltage or current related to the first inductor component, and to generate a feedback signal to the processor system accordingly, wherein said algorithm is arranged to adjust the resulting electric inductance value in response to said feedback signal. Hereby, the resulting inductance of the inductor device can be varied on-line, e.g. in response to operation conditions of the circuit in which the inductor device is connected. This can be used to improve efficiency of certain power electric applications.

Especially, the first inductor component may be a coil formed by a metal wire, e.g. a copper wire, e.g. with a fixed inductance of at least 0.1 mH, preferably with a fixed value of at least 1 mH, e.g. with a fixed value of 1-20 mH.

Especially, the plurality of controllable electric switches of the power convereter may be connected in a full bridge configuration, e.g. comprising 4 controllable electric switches in an H bridge configuration. Especially, the controllable electric switches may comprise insulated gate bipolar transistors (IGBTs), and/or controllable electric switches formed by: mosfet, GTO, IGCT, and/or comprises power electronic switches based on silicon carbide (SiC) or Gallium Nitride (GaN) technologies.

The power converter preferably comprises a capacitor component with a fixed capacitance. The processor system may be arranged to sense a voltage across said capacitor component, and a current through the first inductor component, and to process the sensed voltage and current according to said algorithm configured to control the power converter. Especially, the inductor device may comprise a second inductor component with a fixed inductance, and wherein the first and second inductor components are connected in series between the two external electric terminals. The inductor device may further comprise a third inductor component with a fixed inductance, wherein the processor system is arranged to sense a current through the third inductor component, and to process the sensed voltage and the two sensed currents according to said algorithm configured to control the power converter.

The inductor device may especially be designed to handle an electric power of at least 1 kW, e.g. 10-100 kW or even 1 MW or more, and/or arranged to handle a voltage of at least 100 V across the two external electric terminals. In other embodiments, the inductor device may be arranged for low power applications, e.g. in LED driver electronics etc.

It is to be understood that the inductor device can be arranged to operate with an AC or a DC electric signal at the two external electric terminals. For both AC and DC, the hardware is the same, but in the algorithm, at least a bandpass filter should be adapted accordingly, namely to provide DC component extraction for DC inductor, while fundamental frequency component extraction for AC inductor.

The processor and associated components of the processor system may be selected as components known by the skilled person, as mentioned either in a digital version or an analog version. Especially, the processor may be a digital microprocessor with digital memory and a sampling system with an analog-to-digital converter, such as known in the art. Likewise, a gatedriver circuit suited to drive the switches of the power converter based on a digital input is also known in the art.

In a second aspect, the invention provides a power electric circuit comprising a inductor device according to the first aspect. Especially, such power electric circuit may be a power converter or a rectifier. Even more specifically, power electric circuit may comprise a diode bridge rectifier circuit, e.g. a 3-phase diode bridge rectifier circuit, in which the inductor device forms part. However, in general, the inductor device can be used in a large variety of circuit, including high power circuits handling 1-100 kW or even up to several MW.

In a third aspect, the invention provides a method for providing a controllable electric inductance value, the method comprising
  receiving an input indicative of a inductance value,
  providing an enclosure,
  providing a power converter comprising a plurality of interconnected controllable electric switches,
  providing a first inductor component with a fixed inductance, and being electrically connected to the power converter,
  providing two external electric terminals arranged to be externally accessible from outside the enclosure, wherein at least one of the two external electric terminals is connected to the first inductor component and the power converter, and
  sensing at least one input voltage or current related to one of the two external electric terminals and the first inductor component, and
  executing an algorithm configured to generate a control signal to control the power converter in response to said sensed at least one input voltage or current, so as to provide a resulting electric inductance between the two external electric terminals which corresponds to the controllable electric inductance value input.

It is to be understood that the same advantages and preferred embodiments and features apply for the second and third aspects, as described for the first aspect, and the aspects may be mixed in any way.

BRIEF DESCRIPTION OF THE FIGURES

The invention will now be described in more detail with regard to the accompanying figures of which

The figures illustrate specific ways of implementing the present invention and are not to be construed as being limiting to other possible embodiments falling within the scope of the attached claim set.

DETAILED DESCRIPTION OF THE INVENTION

Figure 1:
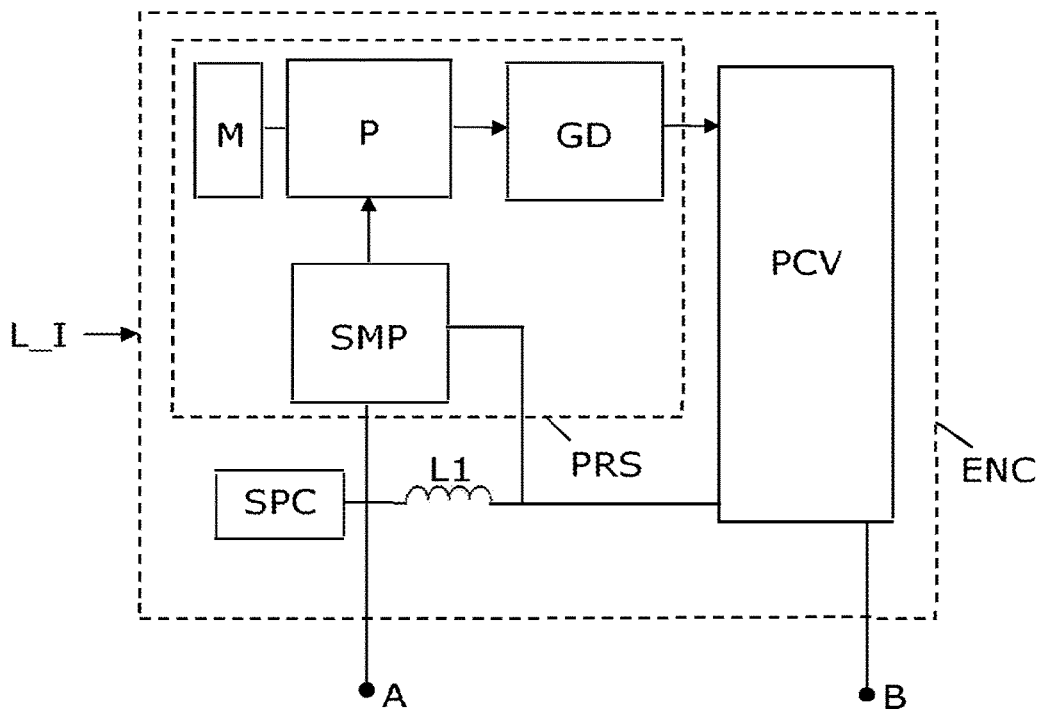
FIG. 1 illustrates a block diagram of an inductor device embodiment.

FIG. 1 illustrates a block diagram of a inductor device embodiment which is arranged to receive a controllable electric inductance value input L_I. The device is arranged to provide a resulting electric inductance between the two external electric terminals A, B, such that the resulting inductance corresponds to the controllable electric inductance value input L_I.

In the shown embodiments, the enclosure ENC houses all of: a processor circuit PRS, a power converter PCV with a plurality of interconnected controllable electric switches, a first inductor component L1 with fixed inductance, and a self powering circuit SPC serving to provide power to all the electric power demanding components inside the enclosure ENC based on input from the external terminals A, B, either in a direct or indirect manner. Hereby, an active two-terminal inductor device is provided which allows its inductance to be adjusted in response to the inductance value input L_I.

As seen, the power converter PCV with controllable electric switches, and the fixed inductor component L1, are connected in series between the two external electric terminals A, B. Further, the self powering circuit SPC is also connected to at least one of the terminals A, B or in other ways connected directly or indirectly to the terminals A, B. In the shown embodiment, the processor system PRS comprises a digital microprocessor P with an associated memory M in which a control algorithm is stored. As an example, a sampling circuit SMP may serve to sample a current through the fixed inductor component L1 and to generate a digital signal output to the microprocessor P accordingly. The sampling circuit SMP may sample one or two further currents or voltages to be included in the digital signal output to the microprocessor P. The microprocessor P is configured to execute the control algorithm stored in the memory M. The control algorithm is configured to generate a control signal to control the power converter PCV in response to the digital signal output from the sampling circuit SMP, via a gate driver circuit GD arranged to control the plurality of controllable electric switches of the power converter PCV. Hereby, a resulting electric inductance between the two external electric terminals A, B can be provided.

In preferred embodiments, the control algorithm in memory M involves a coefficient which can be adjusted in response to the inductance value input L_I, so as to allow the resulting electric inductance between the two external electric terminals to reflect the inductance value input L_I.

In this manner, an active two-terminal inductor with adjustable inductance can be implemented.

The connection of the self powering circuit SPC can be implemented in different ways, where the electric power comes directly or indirectly from the external terminals A, B. In some embodiments, the self powering circuit SPC may be connected to two power terminals of one of the controllable electric switches in the power converter PCV, or in other embodiments, the self powering circuit is connected to a capacitor component, and in yet other embodiments the self powering circuit is connected directly to the external terminals A, B. Still other ways of connecting a self powering circuit are possible by connection via other components of the device to indirectly obtain power from the terminals A, B.

The invention is based on the insight, that the processor system and algorithm allows a resulting inductance which is higher and more stable than with a traditional inductor component with the same dimensions. In addition, the inductance value input L_I allows the inductor device to have a programmable inductance. This can be used in various applications to provide one piece of hardware which can be programmed to a desired inductance value after manufacturing, or it can be used to provide a user programmable inductor, or even a inductor which can adjust its inductance on-line in response to e.g. a voltage related its external electric terminals A, B.

Figure 2:
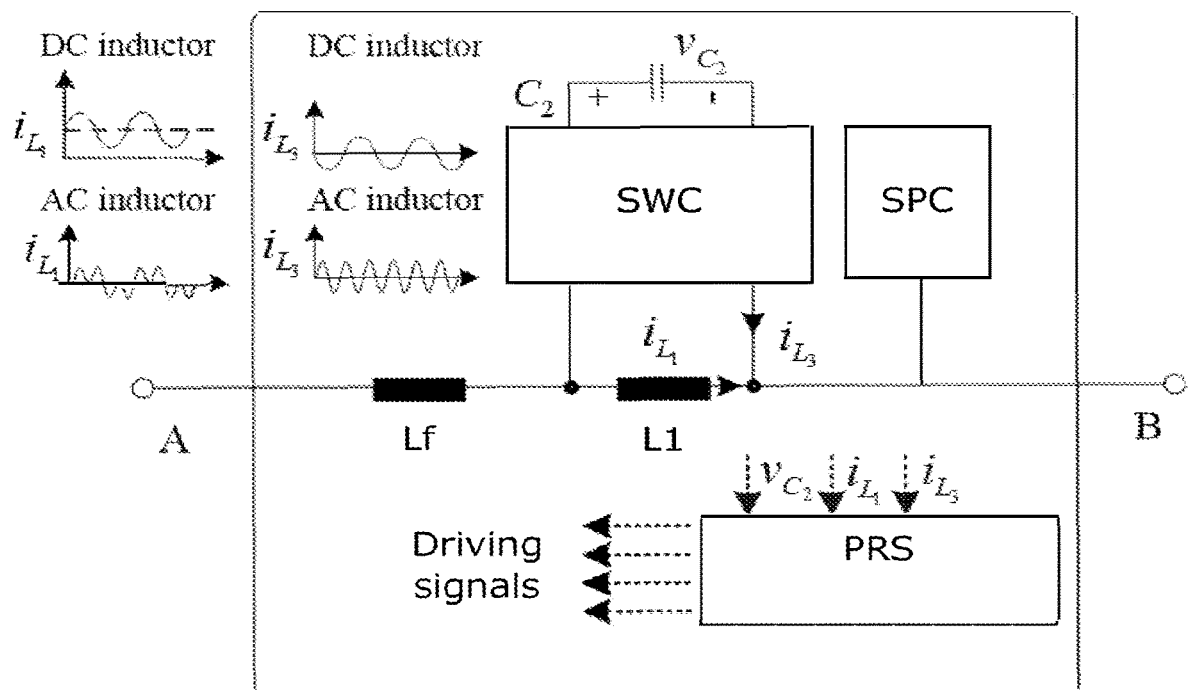
FIG. 2 illustrates another block diagram of an inductor device embodiment.

FIG. 2 shows an embodiment with more details. In this embodiment, the power converter comprises a capacitor component C2 with fixed capacitance connected to the switching circuit SWC, and a second inductor component Lf with fixed inductance. The first and second inductors L1, Lf are seen to be connected in series between the two external electric terminals A, B. The switching circuit SWC is connected across the first inductor L1. The capacitor C2 is connected one the opposite side of the switching circuit SWC than the inductor L1.

The processor system PRS samples three inputs: the current iL1 through the first inductor L1, the voltage VC2 across the capacitor C2, and a current iL3 through a third inductor (L3 is not visible in FIG. 2) connected in relation to the switching circuit SWC. These three inputs iL1, iL3, VC2 are then used in the control algorithm in the processor system PRS to generate driving signals to control the controllable electric switches of the switching circuit SWC. The inserted graphs are used to indicate the input currents iL1 and iL3 in case of the first and second inductors L1, (L3) being either AC or DC inductors.

Figure 3A:
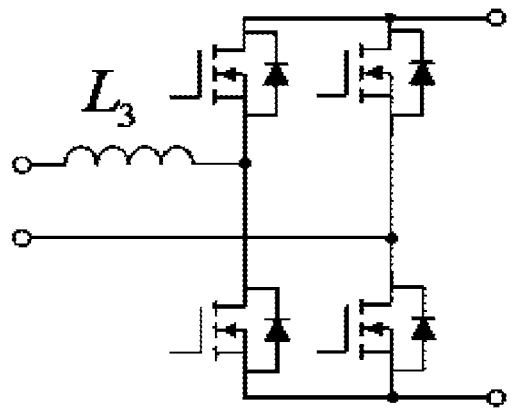
FIGS. 3a, and 3b illustrate power converter circuit examples.
Figure 3B:
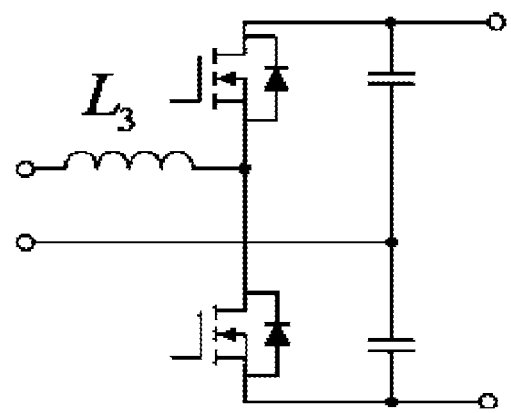

FIGS. 3a-3c illustrate different possible implementations of the switching circuit SWC of the power converter PCV, namely using four, or two controllable electric switches. The power converter PCV can be a DC/AC bi-directional converter. In the shown circuit examples, the third inductor L3 mentioned in relation to FIG. 2 can be seen. It is to be understood that more configurations of the switching circuit can be used, e.g. including implementation with more than four controllable electric switches.

Figure 4A:
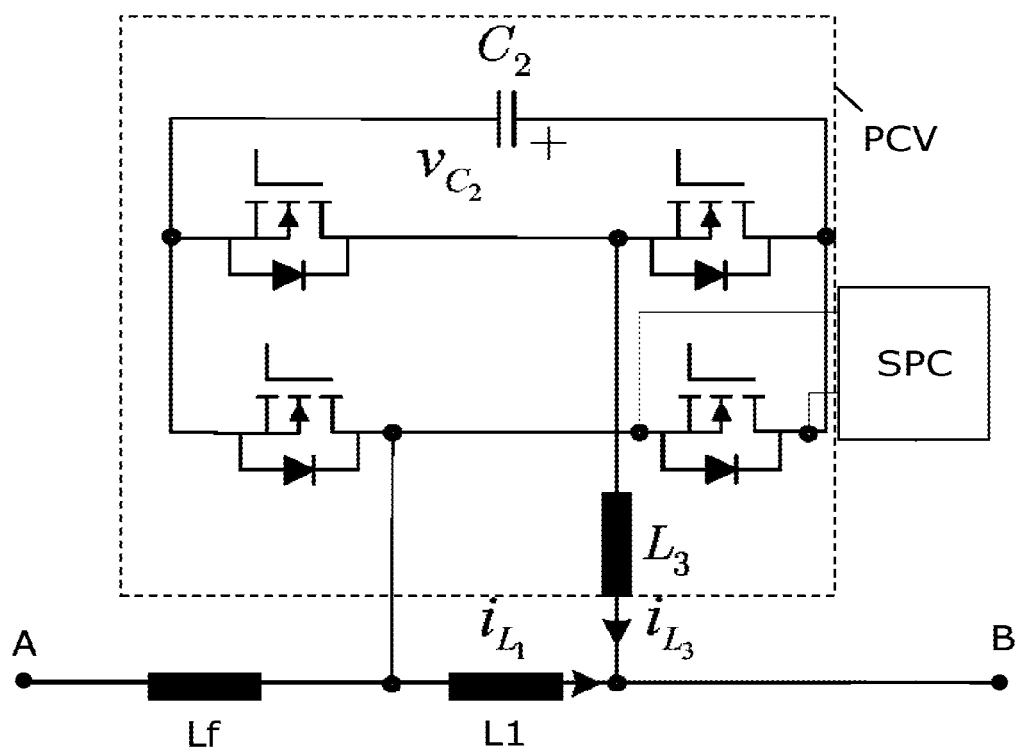
FIGS. 4a and 4b illustrate an embodiment with a power converter circuit example and an example of an algorithm based on one voltage input and two current inputs.

FIG. 4a illustrates an embodiment with a power converter PCV based on the switching circuit with four switches from FIG. 3a connected to the first inductor L1 which is connected in series with the second inductor Lf between the two external electric terminals A, B. As seen, the third inductor L3 is connected to one of the terminals B, while the second inductor Lf is connected to the opposite terminal A. The capacitor C2 is connected to the controllable electric switches and not in direct connection with the external electric terminals A, B.

Figure 4B:
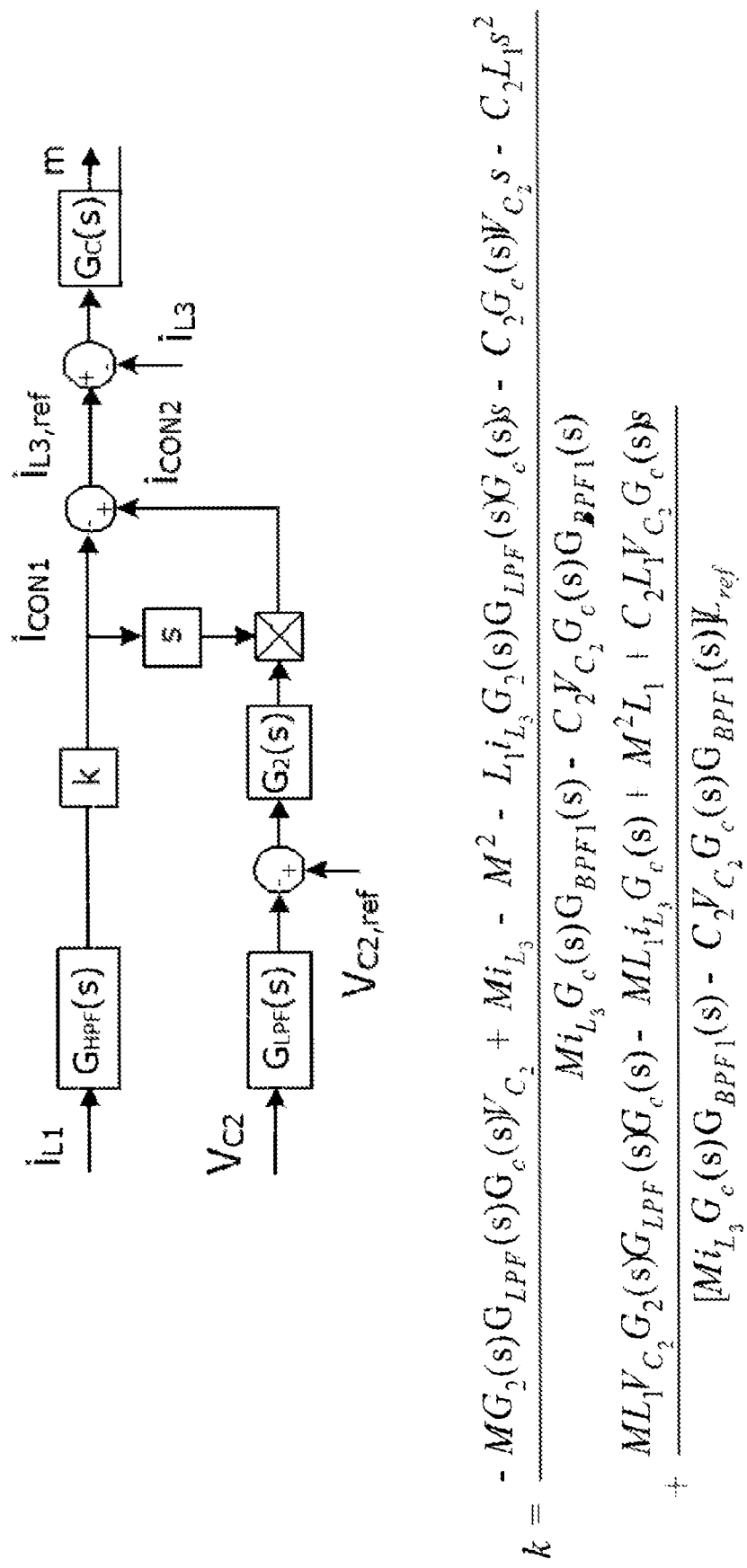

FIG. 4b illustrates an example of an algorithm embodiment for use with the hardware configuration shown in FIG. 4a, taking currents iL1, iL3 and voltage VC2 as inputs. The current icon1 is the control signal related to the equivalent inductance, which is obtained from the harmonics of iL1 extracted through the HPF and the coefficient k which is the inductance control function is shown in FIG. 4b. M is the modulation index which is the maximum of m. In this embodiment, the resulting inductance across the two external electric terminals can be controlled in response to a desired inductance value by changing the algorithm, e.g. by reprogramming the algorithm into a writable memory of the processor system. The current icon2 is the control signal related to the power loss compensation within the enclosure ENC, which is obtained from closed-loop control of the DC component of VC2. The sum of icon1 and icon2 is the reference signal for iL3. Gc(s) is the controller of iL3 current control loop.

Figure 5A:
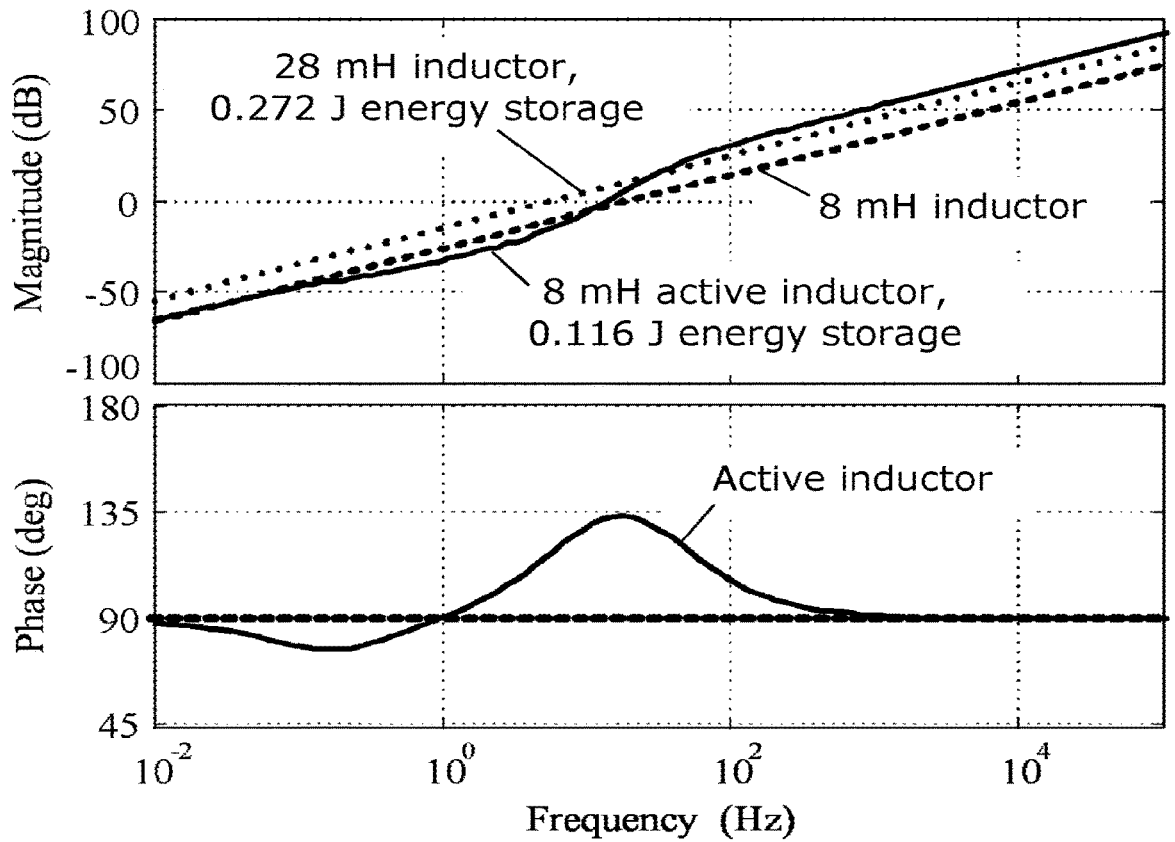
FIGS. 5a, 5b, and 5c illustrate graphs indicating examples of impedance as well as ripple comparisons of passive and active inductors, FIG. 6 illustrate graphs showing inductance comparison between passive and active inductors.

FIG. 5a shows, for the active inductor device embodiment shown in the following, graphs indicating impedance comparison with passive 8 mH and 28 mH inductors (dashed lines) in terms of magnitude and phase as a function of frequency. As seen, for the frequency range of major interest, i.e. above 100 Hz, a high impedance is obtained with the active inductor compared to the bulky and heavy passive inductors.

Figure 5B:
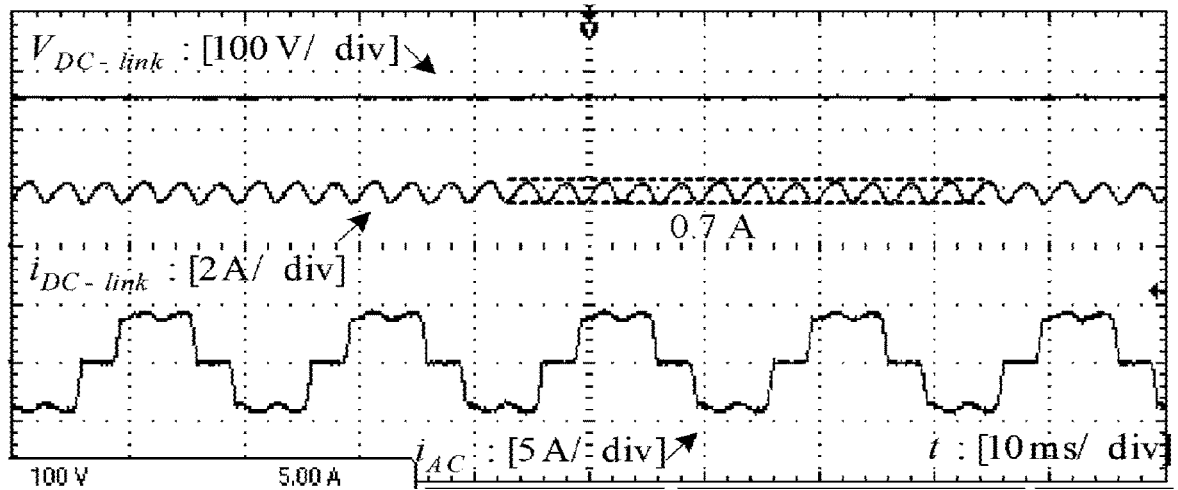
Figure 5C:
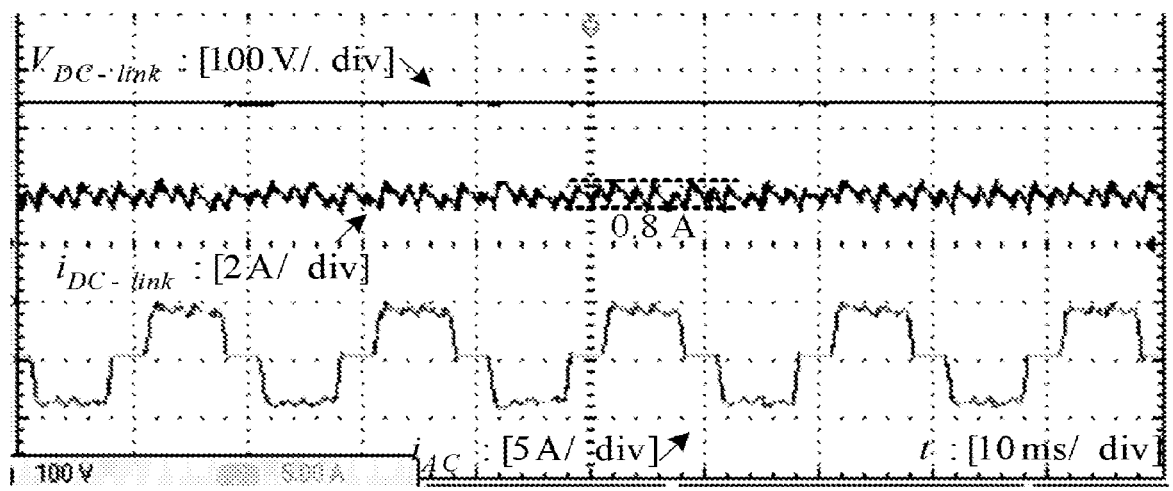

FIGS. 5b and 5c also serve to compare performance of a passive indictor with the active inductor by means of graphs indicating voltage and current as a function of time. FIG. 5b shows results for a 28 mH passive inductor, and FIG. 5c shows results for the active inductor with a 8 mH (0.116 J) energy storage. The difference in system-level performance in terms of the DC-link voltage, current, and AC current are negligible, while the energy storage of the active inductor is 43% of the passive inductor.

Figure 6:
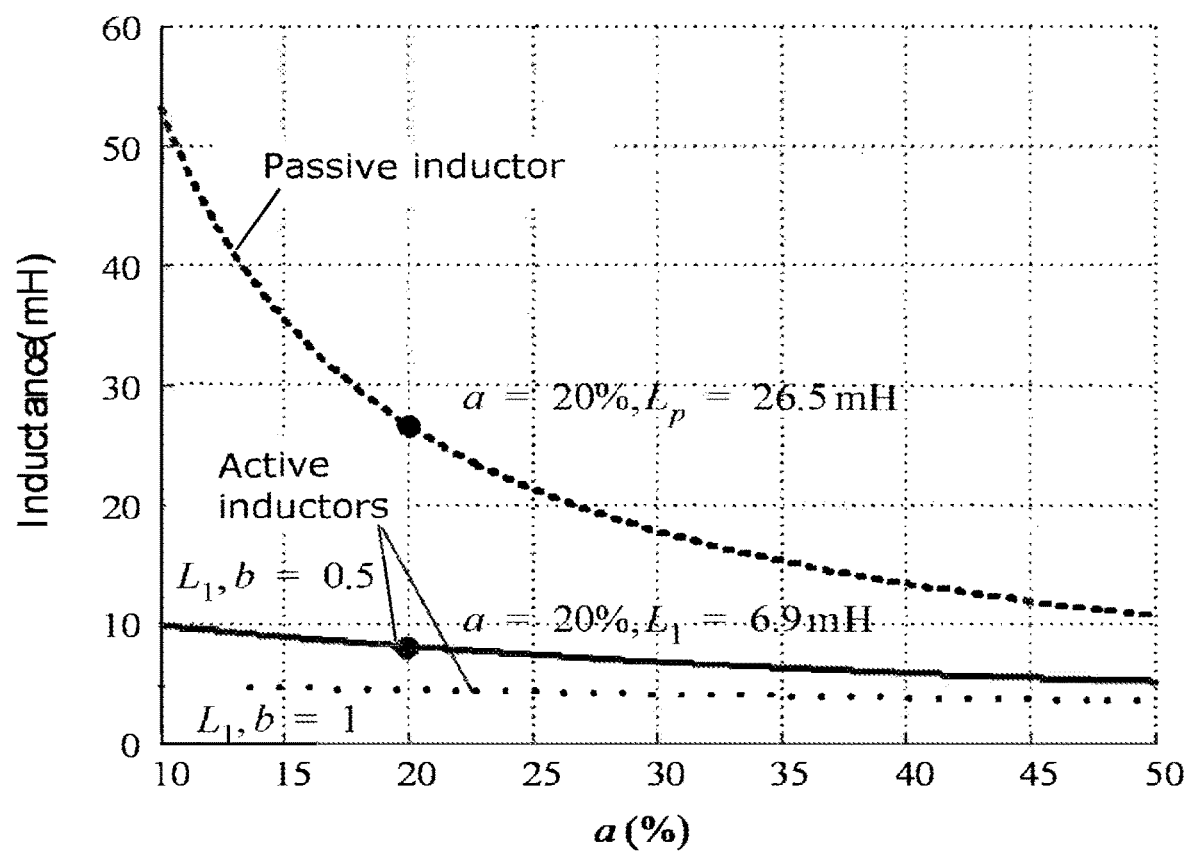

FIG. 6 shows a graph to indicate the inductance reduction possible with the active inductor compared to a passive inductor. Graphs are shown for different ripple current rates $\alpha$, and with the current handled ratio of the auxiliary circuit 3. Graphs are shown the design curves of a passive inductor Lp and two active inductors with different current handled ratio of the auxiliary circuit. As seen, for the same working conditions, e.g. $\alpha=20\%$, a significant reduction of the required inductance can be obtained with the active inductor. Thus, both resulting costs and power density can be improved with the active inductor compared with passive inductors, which are both important parameters within power electric circuits.

Figure 7:
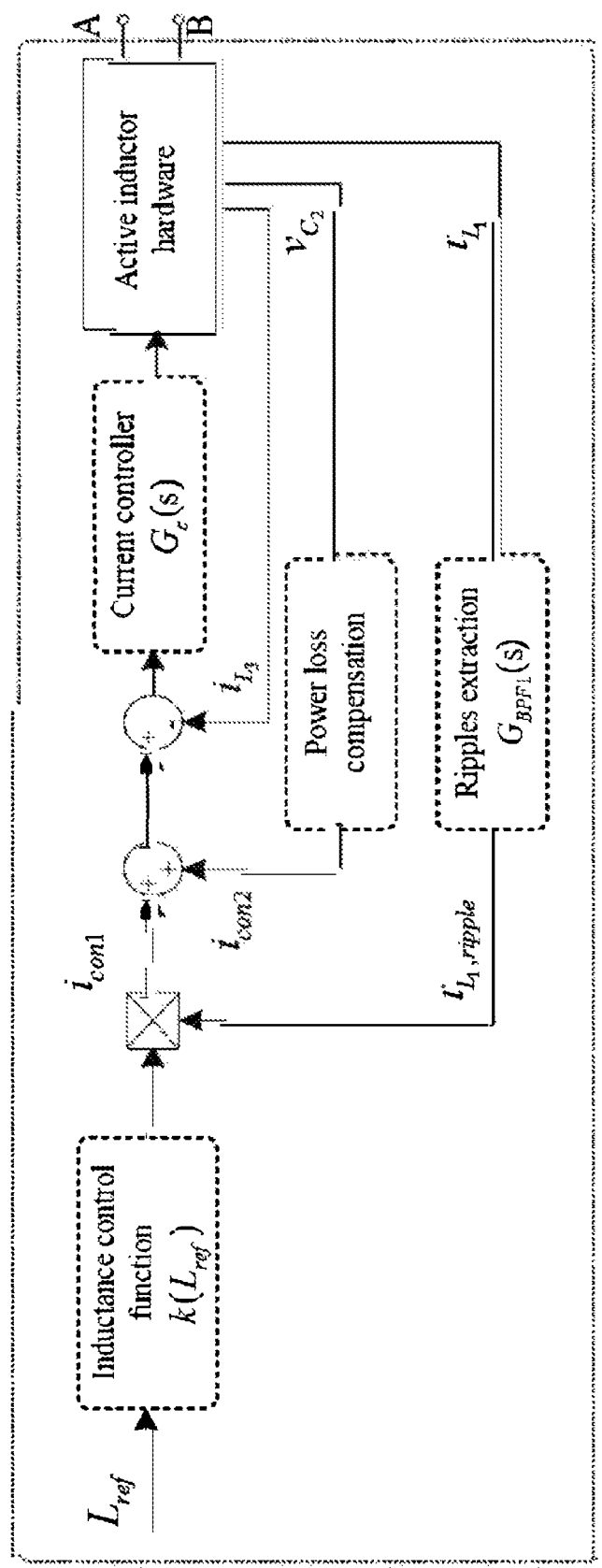
FIG. 7 illustrates an example of an active inductor embodiment where a factor k in the algorithm allows a scalable resulting inductance.

FIG. 7 shows an algorithm embodiment where the resulting inductance between the external electric terminals A, B is controllable by an inductance value input Lref, which serves to determine the factor k. As shown in the previous embodiments, the inputs from the hardware components are the two currents iL1, iL3, and the voltage VC2. The factor k is determined based on the input inductance value Lref as indicated in FIG. 4b.

The control signal of the variable active inductor contains two parts, icon1 and icon2. The signal icon1 is used for inductance programming and icon2 is used for internal power loss compensation to compensate for power loss in the hardware. As seen, the input current iL1 is used for ripple extraction, i.e. to extract ripple from either DC or AC signals. The active inductor hardware is understood to be processor system PRS hardware, the power converter PCV and the fixed inductor components L1 and L3.

Figure 8:
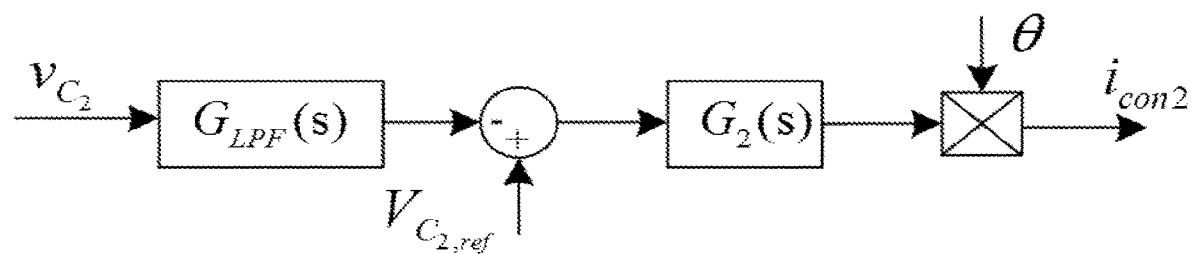
FIG. 8 illustrates a power loss compensation algorithm example.

FIG. 8 illustrates a specific example of the mentioned power loss compensation algorithm part.

Figure 9:
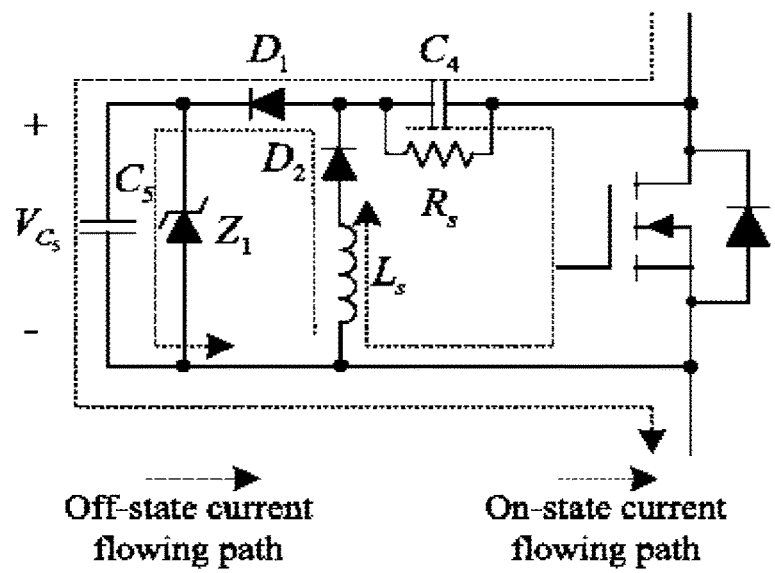
FIG. 9 illustrates an example of a self powering circuit.

FIG. 9 indicates a specific example of a self powering circuit SPC serving to provide power to all power demanding circuits of the inductor device based on electric input from the external electric terminals A, B, namely here shown as a circuit to be connected to two power terminals of one of the controllable electric switches in the power converter, e.g. the two power terminals of a MOSFET.

Figure 10:
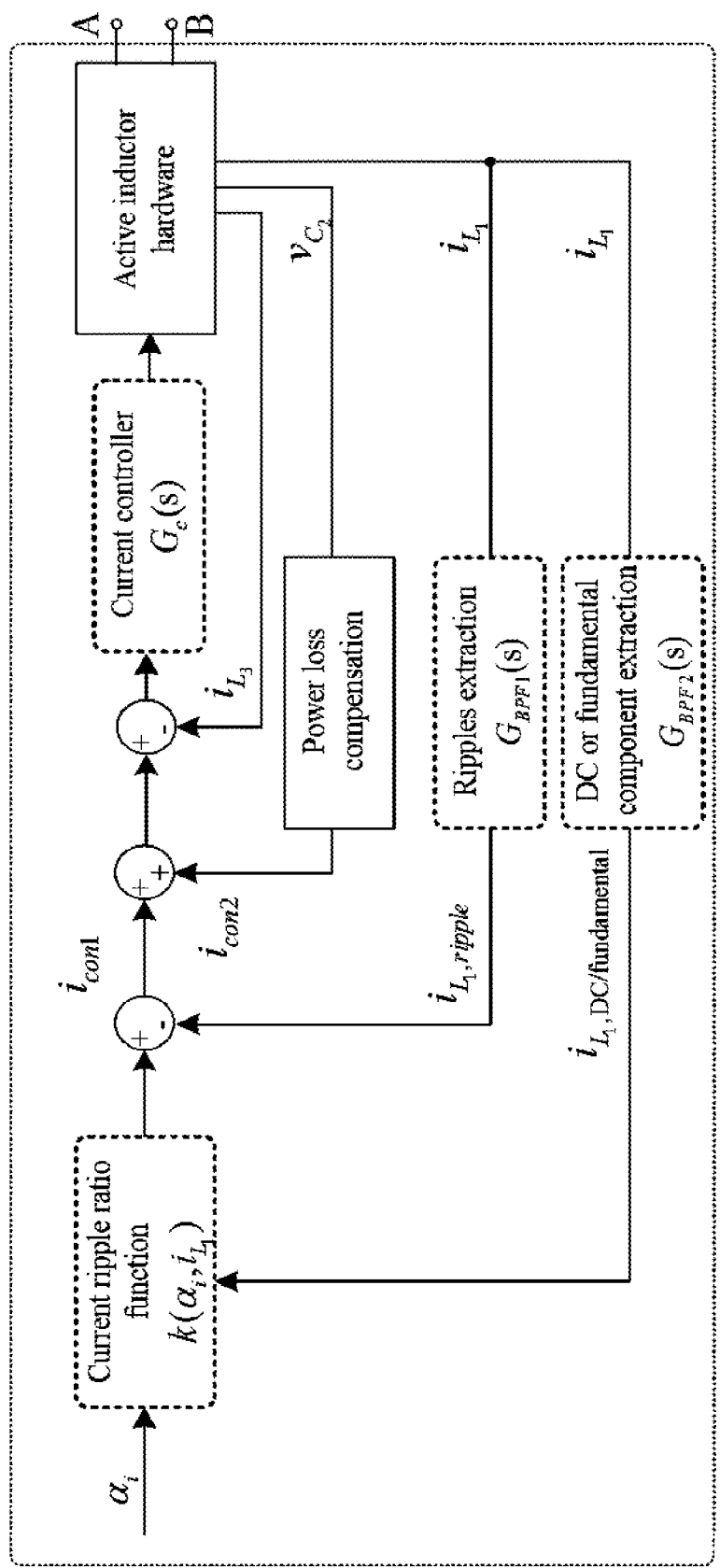
FIG. 10 shows an example of an adaptive variable inductance algorithm.

FIG. 10 illustrates an algorithm embodiment where the resulting inductance is on-line adjustable during normal operation, e.g. adaptive with load condition for a specified current ripple ratio αi. For example, when the load increases, if the inductance is constant, the ripple will be larger. However, with the variable inductor device, the inductance will be adaptive with the load to be larger, in order to keep the same current ripple ratio for different loads. Still, as seen, this algorithm is based on the three inputs iL1, iL3, and VC2 as in the previous embodiments. The ripple extraction is based on bandpass filters GBPF1, GBPF2.

The current ripple ratio function k is:

$$k = \alpha_i i_{L_1, DC/fundamental}$$

Figure 11:
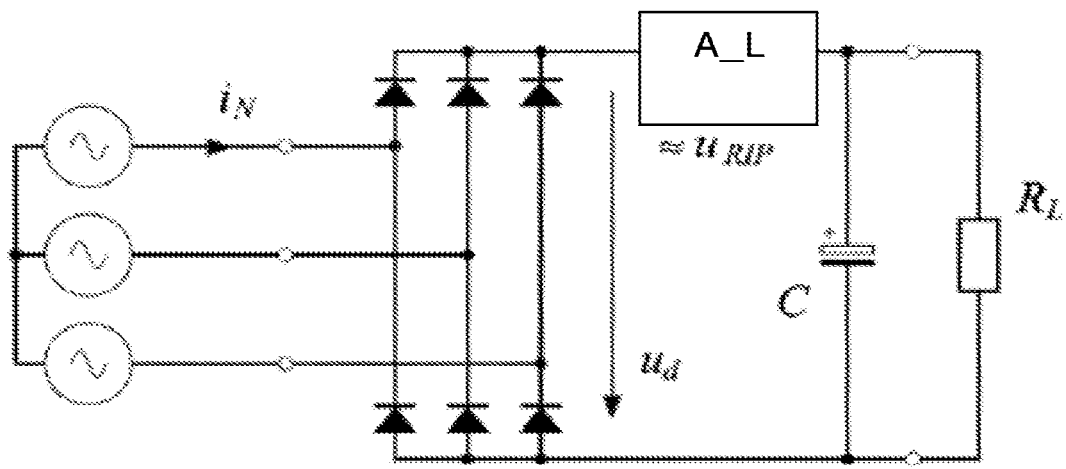
FIG. 11 illustrates a 3-phase diode bridge rectifier circuit application where the inductor device of the invention is used.

FIG. 11 shows a specific example of a three-phase diode bridge rectifier circuit in which the inductor device A_L is used as inductor. RL indicates the load.

Figure 12:
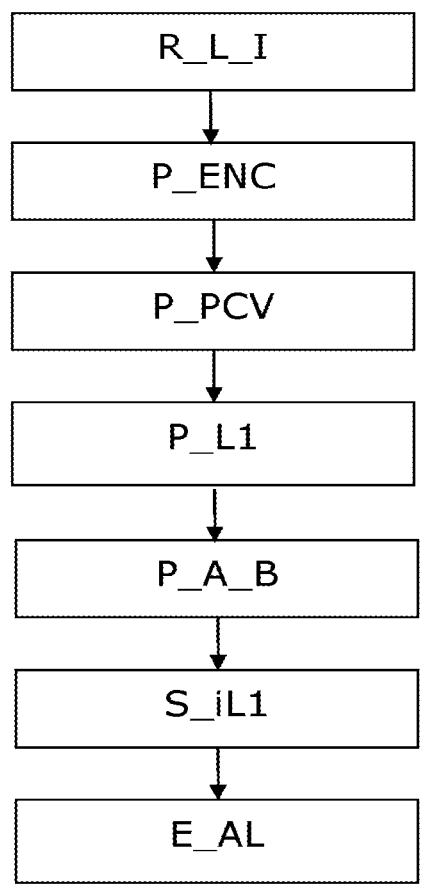
FIG. 12 illustrates steps of a method embodiment.

FIG. 12 illustrates steps of an embodiment of a method for providing a controllable electric inductance value. The method comprises receiving R_L_I an input indicative of a inductance value, e.g. a desired inductance input by a user. The method comprises providing P_ENC an enclosure, providing P_PCV a power converter comprising a plurality of interconnected controllable electric switches, providing P_L1 a first inductor component with a fixed inductance, and being electrically connected to the power converter, providing P_A_B two external electric terminals arranged to be externally accessible from outside the enclosure, wherein at least one of the two external electric terminals is connected to the first inductor component and the power converter. With these hardware components, the method further comprises sensing, e.g. sampling, S_iL1 at least one input current through the first inductor component, and executing E_AL an algorithm, preferably on a processor system, wherein the algorithm is configured to generate a control signal to control the power converter in response to said sensed input current, so as to provide a resulting electric inductance between the two external electric terminals which corresponds to the controllable electric inductance value input.

In general, the inductor device according to the invention is useful for power circuit designs within a wide range of applications, such as within renewable energy. Specific application examples are: wind turbine power converters, photovoltaic inverters, DC-links of modular multi-level converters in High-Voltage Direct Current (HVDC), and motor drive DC-links.

To sum up: the invention provides an active two-terminal inductor device with a controllable inductance based on a inductance value input L_I. A processor system PRS executes an algorithm which controls a power converter PCV with controllable electric switches connected to the two external terminals A, B along with a fixed value inductor component L1. Based on sampling of at least the voltage across the inductor component L1, the algorithm controls the power converter PCV to provide a resulting inductance across the external terminals A, B which serves to match the inductance value input L_I.

Although the present invention has been described in connection with the specified embodiments, it should not be construed as being in any way limited to the presented examples. The scope of the present invention is to be interpreted in the light of the accompanying claim set. In the context of the claims, the terms "including" or "includes" do not exclude other possible elements or steps. Also, the mentioning of references such as "a" or "an" etc. should not be construed as excluding a plurality. The use of reference signs in the claims with respect to elements indicated in the figures shall also not be construed as limiting the scope of the invention. Furthermore, individual features mentioned in different claims, may possibly be advantageously combined, and the mentioning of these features in different claims does not exclude that a combination of features is not possible and advantageous.

The invention claimed is:

1. An inductor device with a controllable electric inducance value input (L_I), comprising:
    an enclosure (ENC);
    a power converter (PCV) comprising a plurality of interconnected controllable electric switches (SWC);
    a first inductor component (L1) with a fixed inductance, and being electrically connected to the power converter (PCV);
    two external electric terminals (A, B) arranged to be externally accessible from outside the enclosure (ENC), wherein at least one of the two external electric terminals (A, B) are connected to the first inductor component (L1) and the power converter (PCV); and
    a processor system (PRS) arranged to sense at least one input voltage or current (iL1, VC2) related to one of the two external electric terminals (A, B) and the first inductor component (L1) and to process the sensed at least one input voltage or current (iL1, VC2) according to an algorithm configured to control the power converter (PCV), so as to provide a resulting electric inductance between the two external electric terminals (A, B) which corresponds to the controllable electric inductance value input (L_I).

2. The inductor device according to claim 1, wherein the processor system (PRS) comprises
    a sampling circuit (SMP) arranged to sample said sensed at least one input voltage or current (iL1, VC2) and to generate a digital signal output accordingly,
    a digital processor (P) configured to execute an algorithm stored in a memory (M), which algorithm is configured to generate a control signal to control the power converter (PCV) in response to the digital signal output from the sampling circuit (SMP), so as to provide said resulting electric inductance between the two external electric terminals (A, B), and a gate driver circuit (GD) arranged to control the plurality of controllable electric switches (SWC) in response to the control signal from the processor (P).

3. The inductor device according to claim 1, wherein the processor system (PRS) comprises an analog controller in which said algorithm is implemented by means of an analog electronic circuit.

4. The inductor device according to claim 1, wherein the enclosure (ENC) is configured for housing the first inductor component (L1), the power converter (PCV), and the processor system (PRS).

5. The inductor device according to claim 1, wherein the power converter (PCV), and the processor system (PRS) are arranged inside a resin or a gel and positioned within the enclosure (ENC) along with the first inductor component (L1).

6. The inductor device according to claim 1, comprising a self powering circuit (SPC) connected to receive electric power from the two external electric terminals (A, B) in a direct or indirect manner, and to convert said electric power for powering the power converter (PCV), and the processor system (PRS).

7. The inductor device according to claim 1, wherein the processor system (PRS), the power converter (PCV), and the first inductor component (L1) are arranged on one single Printed Circuit Board.

8. The inductor device according to claim 2, configured to receive the controllable electric inductance value input (L_I) into said memory (M).

9. The inductor device according to claim 8, wherein said algorithm involves an adjustable coefficient (k) which is adjustable in response to the inductance value input (L_I).

10. The inductor device according to claim 8, configured to receive the controllable electric inductance value input (L_I) into said memory from outside the enclosure (ENC).

11. The inductor device according to claim 10, wherein the memory (M) is programmable from outside the enclosure (ENC) by means of at least one externally accessible electric terminal.

12. The inductor device according to claim 10, wherein the memory (M) is programmable from outside the enclosure (ENC) by means of a wireless interface.

13. The inductor device according to claim 8, configured to receive the controllable electric inductance value input (L_I) by means of a pre-programmed Read Only Memory type memory (M) which at least contains a preprogrammed code indicative of the controllable electric inductance value input (L_I).

14. The inductor device according to claim 1, configured to receive the controllable electric inductance value input (L_I) by means of an adjustable device with a plurality of different settings which can be read by the processor (P).

15. The inductor device according to claim 1, wherein the processor system (PRS) is arranged to sense a voltage or current, and to generate a feedback signal to said algorithm, and wherein said algorithm is arranged to adjust the resulting electric inductance value in response to said feedback signal.

16. The inductor device according to claim 1, being arranged to provide a controllable electric inductance value which is at least a factor of 2 higher than an electric inductance of the first electric inductor component (L1).

17. The inductor device according to claim 1, wherein the first inductor component (L1) is a coil formed by a wound metal wire.

18. The inductor device according to claim 1, wherein the plurality of controllable electric switches (SWC) of the power converter (PCV) are connected in a full bridge configuration.

19. The inductor device according to claim 1, wherein the power converter (PCV) comprises a capacitor component (C2) with a fixed capacitance.

20. The inductor device according to claim 19, wherein the processor system (PRS) is arranged to sense a voltage (VC2) across the capacitor component (C2), and a current (iL1) through the first inductor component (L1), and to process the sensed voltage and current (VC2, iL1) according to said algorithm configured to control the power converter (PCV).

21. The inductor device according to claim 19, comprising a second inductor component (Lf) with a fixed inductance, and wherein the first and second inductor components (L1, Lf) are connected in series between the two external electric terminals (A, B).

22. The inductor device according to claim 21, comprising a third inductor component (L3) with a fixed inductance, and wherein the processor system (PRS) is arranged to sense a current (iL3) through the third inductor component (L3), and to process the sensed voltage and the two sensed currents (VC2, iL1, iL3) according to said algorithm configured to control the power converter (PCV).

23. The inductor device according to claim 1, arranged to handle an electric power of at least 1 kW, or arranged to handle a voltage of at least 100 V across the two external electric terminals (A, B).

24. The inductor device according to claim 1, arranged to operate with an AC electric signal at the two external electric terminals (A, B).

25. The inductor device according to claim 1, arranged to operate with a DC electric signal at the two external electric terminals (A, B).

26. A power electric circuit, comprising: an inductor device according to claim 1.

27. A method for providing a controllable electric inductance value (C), the method comprising
receiving (R_C_I) an input indicative of a inductance value;
providing (P_ENC) an enclosure;
providing (P_PCV) a power converter comprising a plurality of interconnected controllable electric switches;
providing (P_L1) a first inductor component with a fixed inductance, and being electrically connected to the power converter;
providing (P_A_B) two external electric terminals arranged to be externally accessible from outside the enclosure, wherein at least one of the two external electric terminals is connected to the first inductor component and the power converter;
sensing (S_iL1) at least one input voltage or current related to one of the two external electric terminals and the first inductor component; and
executing (E_AL) an algorithm configured to generate a control signal to control the power converter in response to said sensed at least one input voltage or current, so as to provide a resulting electric inductance between the two external electric terminals which corresponds to the controllable electric inductance value input.

* * * * *